United States Patent
Kang

(10) Patent No.: US 8,576,621 B2
(45) Date of Patent: Nov. 5, 2013

(54) NONVOLATILE MEMORY DEVICE AND METHOD OF OPERATING THE SAME

(75) Inventor: Tai Kyu Kang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 177 days.

(21) Appl. No.: 12/647,576

(22) Filed: Dec. 28, 2009

(65) Prior Publication Data

US 2010/0214853 A1    Aug. 26, 2010

(30) Foreign Application Priority Data

Feb. 26, 2009  (KR) .................. 10-2009-0016319

(51) Int. Cl.
*G11C 11/34* (2006.01)
(52) U.S. Cl.
USPC .................................... 365/185.03
(58) Field of Classification Search
USPC .................................... 365/185.03
See application file for complete search history.

(56) References Cited

U.S. PATENT DOCUMENTS

| 7,023,735 B2* | 4/2006 | Ban et al. ............... 365/185.2 |
| 7,911,834 B2* | 3/2011 | Cornwell et al. ........ 365/185.03 |
| 2006/0268621 A1* | 11/2006 | Maayan et al. .......... 365/185.22 |
| 2008/0244367 A1* | 10/2008 | Chin et al. ............... 714/800 |

FOREIGN PATENT DOCUMENTS

KR     100837282     6/2008

OTHER PUBLICATIONS

Notice of Preliminary Rejection issued from Korean Intellectual Property Office on Jul. 22, 2010.

* cited by examiner

*Primary Examiner* — Anthan Tran
(74) *Attorney, Agent, or Firm* — IP & T Group LLP

(57) ABSTRACT

A nonvolatile memory device includes a control unit configured to measure a threshold voltage distribution of each of selected pages between a start voltage and an end voltage by performing a read operation on each page in response to a command set for analyzing the threshold voltage distribution, to compare the measured threshold voltage distribution with a reference threshold voltage distribution, and to determine a read voltage having a least amount of errors upon the read operation being performed.

5 Claims, 4 Drawing Sheets

NONVOLATILE MEMORY DEVICE AND METHOD OF OPERATING THE SAME

CROSS-REFERENCE TO RELATED APPLICATIONS

Priority to Korean patent application number 10-2009-0016319 filed on Feb. 26, 2009, the entire disclosure of which is incorporated by reference herein, is claimed.

BACKGROUND OF THE INVENTION

One or more embodiments of the present invention relate to a nonvolatile memory device and, more particularly, to a nonvolatile memory device and a method of operating the device, which are capable of checking the state of a memory cell by calculating a threshold voltage distribution of the memory cell based on a threshold voltage distribution of a reference memory cell.

A nonvolatile memory device has the advantages of a random access memory (RAM), enabling the writing and erasure of data, and a read only memory (ROM), retaining data even without the supply of power, and so has recently been widely used for the storage media of portable electronic devices, such as digital cameras, personal digital assistants (PDAs), and MP3 players.

The nonvolatile memory device includes a memory cell array, a row decoder, a page buffer unit, etc. The memory cell array includes a plurality of word lines elongated in rows, a plurality of bit lines elongated in columns, and a plurality of cell strings corresponding to respective bit lines.

Memory cells have varying threshold voltages according to their program states. Ideally, the memory cells have the same threshold voltage according to the state of data to be stored. However, when a program operation is actually performed on the memory cells, the threshold voltages of the memory cells have probability distributions in some regions because of various external environments, such as the device characteristics and the coupling effect.

If such probability distributions are calculated and checked, it is possible to verify whether a corresponding memory device has been programmed with a correct threshold voltage after a program operation has been performed.

To this end, the locations of the memory cells are checked by performing a read operation while increasing a specific voltage supplied to a selected word line on a page basis, and the above operation is repeatedly performed on a number of pages. Accordingly, threshold voltage distributions of the memory cells can be checked. To check the threshold voltage distributions of memory cells on a memory-block basis, a considerable amount of time is required because the above operation must be repeatedly performed on all of the pages.

SUMMARY OF THE INVENTION

Exemplary embodiments of the present invention relate to a nonvolatile memory device and a method of operating the same, which are capable of checking the characteristics of memory cells by quickly calculating the threshold voltage distributions of the memory cells within the nonvolatile memory device.

A nonvolatile memory device according to an embodiment of the present invention includes a control unit configured to measure a threshold voltage distribution of each of selected pages between a start voltage and an end voltage for a read operation by performing the read operation on each page in response to a command set for analyzing the threshold voltage distribution, to compare the measured threshold voltage distribution with a reference threshold voltage distribution, and to determine a read voltage having a least amount errors when a subsequent read operation is performed.

The command set includes a command to initiate analysis of a threshold voltage, a first address at which the analysis of the threshold voltage is started, a second address at which the analysis of the threshold voltage is terminated, and voltage information, including the start voltage, the end voltage, and a step voltage.

The nonvolatile memory device further includes a counter configured to set a loop frequency that the read operation according to the first and second addresses is repeated and to count the number of times that the loops have been executed.

The nonvolatile memory device further includes a memory configured to store information with respect to the reference threshold voltage distribution and the measured threshold voltage distribution.

The control unit is configured to determine a read voltage based on the information with respect to the threshold voltage distributions, to store the determined read voltage in the memory, and to control the stored read voltage to facilitate the stored read voltage being used upon a subsequent data read operation being performed.

A method of operating a nonvolatile memory device according to another embodiment of the present invention includes receiving a command set for analyzing a threshold voltage distribution, resetting a page buffer and setting a count value based on address information included in the command set, setting a start voltage based on voltage information included in the command set and performing a read operation, repeatedly performing the read operation while raising the read voltage by a step voltage value included in the command set and, upon the read voltage reaching an end voltage included in the command set, raising a count value by '1', measuring a threshold voltage distribution by repeatedly performing the read operation and the count operation while changing a page address until the count value reaches a maximum value, and comparing a previously stored reference threshold voltage distribution with the measured threshold voltage distribution and analyzing a result of the comparison.

Receiving a command set includes receiving a command to initiate analysis of a threshold voltage, receiving a first address at which the analysis of the threshold voltage is started, receiving a second address at which the analysis of the threshold voltage is terminated, and receiving voltage information, including the start voltage, the end voltage, and the step voltage.

The method further includes receiving a confirmation command after the first and second addresses have been received and a confirmation command after the voltage information has been received.

The first and second addresses respectively include an address of a memory block and an address of a page.

The count value facilitates counting an address from the first address and moving to the second address.

The method further includes setting and storing a read voltage for a subsequent data read operation based on a result of the comparison and analysis.

DESCRIPTION OF INVENTION

Figure 1A:
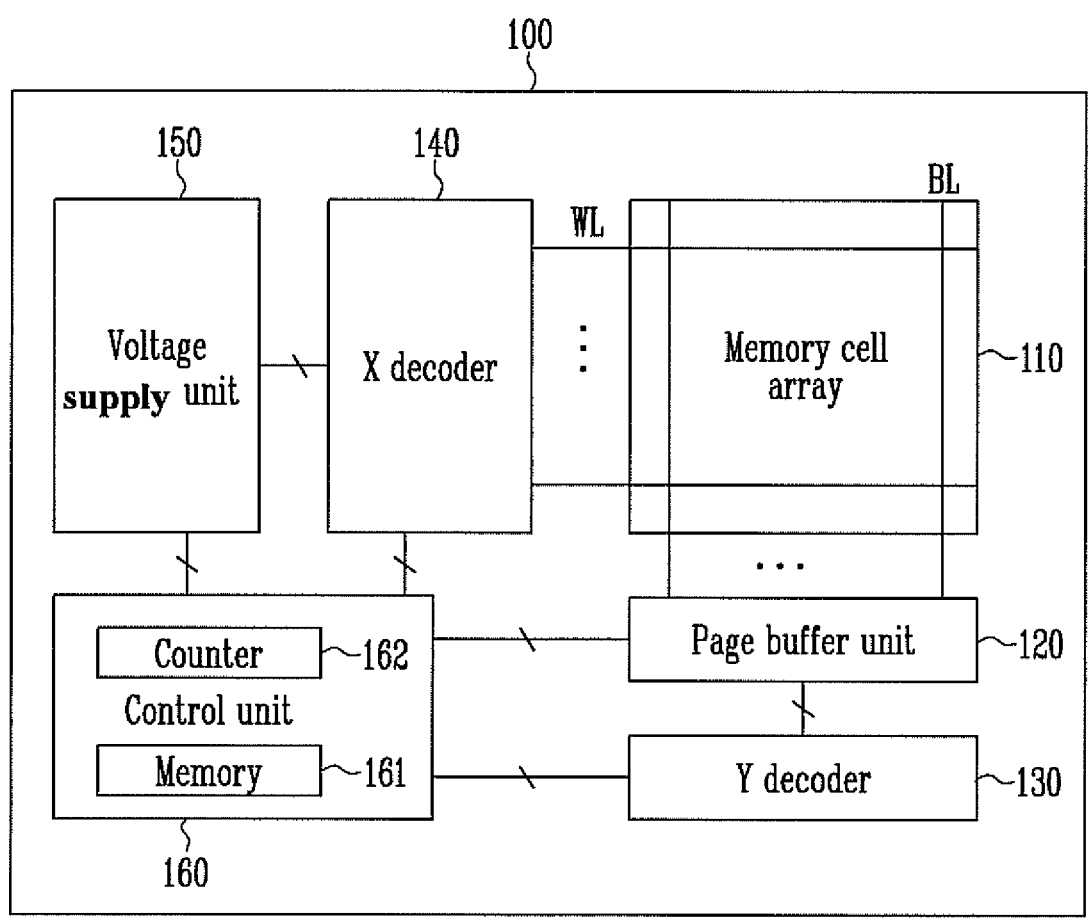
FIG. 1A is a block diagram of a nonvolatile memory device.

Hereinafter, embodiments of the present invention are described in detail with reference to accompanying drawings. The drawing figures are provided to allow those having ordinary skill in the art to understand the scope of the embodiments of the present invention.

FIG. 1A is a block diagram of a nonvolatile memory device 100.

Referring to FIG. 1A, the nonvolatile memory device 100 includes a memory cell array 110, a page buffer unit 120, a Y decoder 130, an X decoder 140, a voltage supply unit 150, and a control unit 160.

The memory cell array 110 includes memory cells selected on a memory-block basis and configured to have data programmed therein or read therefrom. The memory cells are coupled together by word lines and bit lines.

The page buffer unit 120 includes page buffers PB coupled to bit lines. The page buffers PB are configured to store data to be stored in memory cells coupled to a bit line or to read data stored in memory cells and store the read data.

The Y decoder 130 is configured to provide the page buffers PB with a data IO path. The X decoder 140 is configured to enable a selected memory block and to couple each word line to a line for supplying operating voltages.

The voltage supply unit 150 is configured to generate a high voltage for a program, read, or erase operation, and the control unit 160 is configured to control the operations of the nonvolatile memory device 100 for the program, read, or erase operation.

The control unit 160 further includes a memory 161. The memory 161 is configured to store information with respect to the threshold voltages of memory cells, which is read in order to analyze a threshold voltage distribution of the memory cells, and information about a reference threshold voltage distribution of memory cells.

When a test command (i.e., a new command) for analyzing a threshold voltage distribution is received, the control unit 160 checks the threshold voltage of a designated page based on a set voltage, stores the checked threshold voltage in the memory 161, determines whether an abnormal memory cell exists, such as a slow cell, by comparing the checked threshold voltage with a previously stored reference threshold voltage distribution, and stores a result of the determination in the memory 161 or outputs the result of the determination externally.

The control unit 160 further includes a counter 162 having a count function. The counter 162 may be included in the control unit 160 or may be configured as a separate element outside the control unit 162. The counter 162 is configured to count the number of loops that an operation is repeated in response to an address inputted to test a threshold voltage distribution. Furthermore, the control unit 160 controls an operation of analyzing a threshold voltage distribution according to a counted loop frequency.

The memory 161 stores an algorithm for analyzing the threshold voltage distribution such that the control unit 160 can control the operation of analyzing the threshold voltage distribution according to the stored algorithm.

Figure 1B:
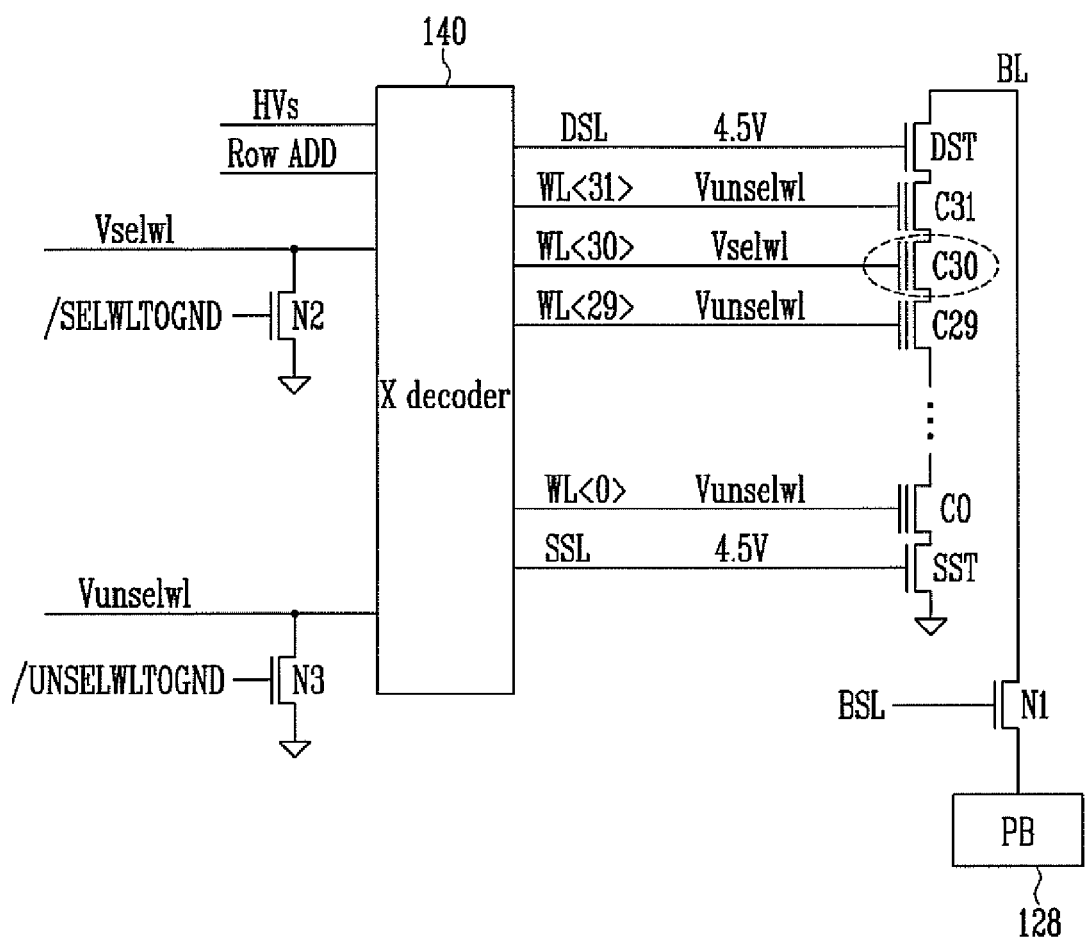
FIG. 1B is a detailed circuit diagram of a cell string of the memory cell array shown in FIG. 1A.

FIG. 1B is a detailed circuit diagram of a cell string of the memory cell array shown in FIG. 1A.

Referring to FIG. 1B, the cell string includes $0^{th}$ to thirty-first memory cells C0 to C31 coupled in series between a drain select transistor DST and a source select transistor SST. $0^{th}$ to thirty-first word lines WL<0:31> are respectively coupled to the gates of the $0^{th}$ to thirty-first memory cells C0 to C31. A drain selection line DSL is coupled to the gate of the drain select transistor DST, and a source selection line SSL is coupled to the gate of the source select transistor SST.

A bit line BL is coupled to the drain of the drain select transistor DST. A first NMOS transistor N1 is coupled between the bit line BL and a page buffer PB 128.

The X decoder 140 is coupled to the drain selection line DSL, the source selection line SSL, the $0^{th}$ to thirty-first word lines WL<0:31>, and a voltage line for supplying operation voltages.

The X decoder 140 is configured to receive a selected word line voltage Vselwl for a selected word line in order to read data, an unselected word line voltage Vunselwl for unselected word lines, and high voltages HVs for a program operation, etc. The X decoder 140 is also configured to receive a row address Row ADD, including information about a memory block from which data will be read and information about a word line to be programmed.

A second NMOS transistor N2 is coupled between a line through which the selected word line voltage Vselwl is inputted and a ground node. A third NMOS transistor N3 is coupled between a line through which the unselected word line voltage Vunselwl is inputted and the ground node.

A selected word line-to-ground signal /SELWLTOGND is inputted to the gate of the second NMOS transistor N2, and an unselected word line-to-ground signal /UNSELWLTOGND is inputted to the gate of the second NMOS transistor N3.

When data are read, 4.5 V is inputted to the drain selection line DSL and the source selection line SSL to thereby turn on the drain select transistor DST and the source select transistor SST. In order to read data, the selected word line voltage Vselwl is inputted to a selected word line. In this embodiment of the present invention, it is assumed that the thirtieth word line WL<30> is selected in order to read data.

Furthermore, the unselected word line voltage Vunselwl is supplied to the remaining unselected word lines.

A data read operation is described in more detail below.

Figure 1C:
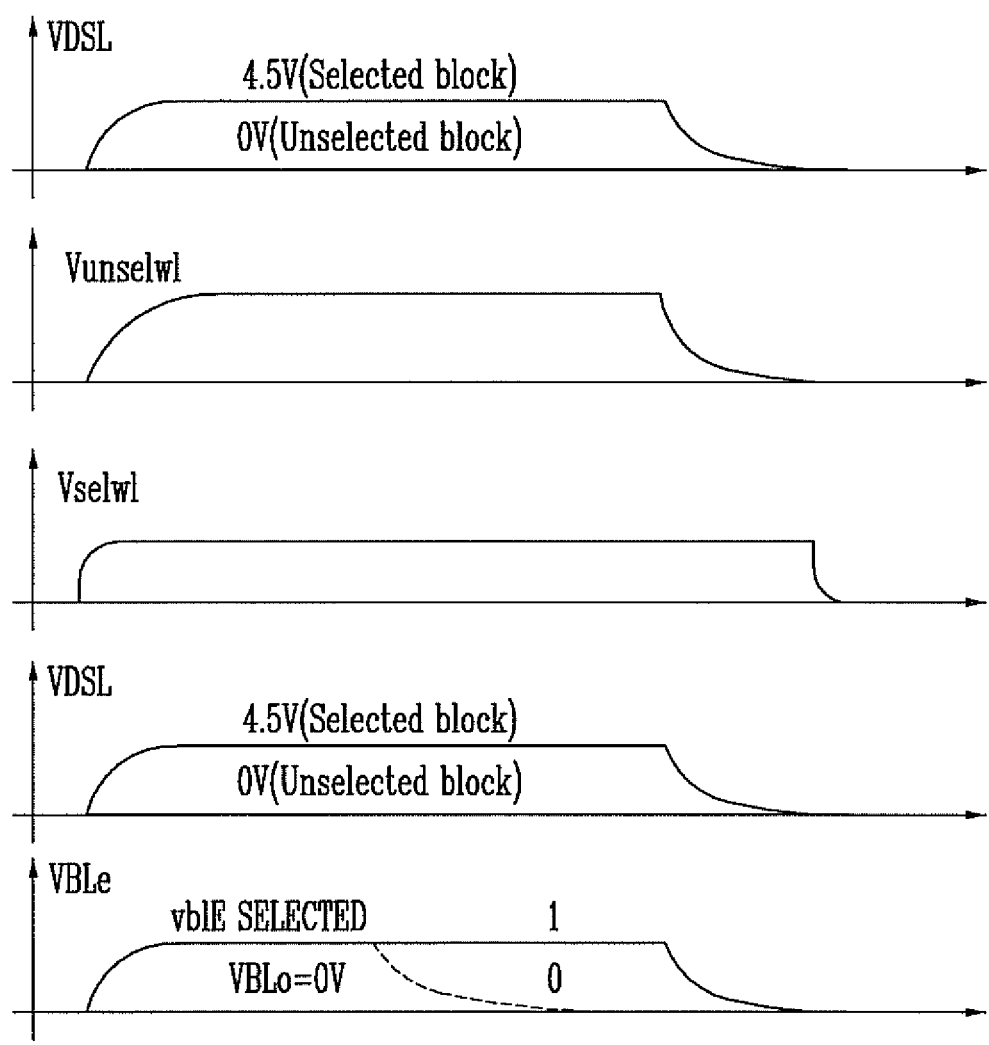
FIG. 1C is a timing diagram illustrating an operation of reading data.

FIG. 1C is a timing diagram illustrating an operation of reading data.

Referring to FIG. 1C, a selected bit line is precharged in response to a data read command. At this time, an unselected bit line maintains 0 V. In this embodiment of the present invention, the even bit line BLe is selected and precharged.

Next, voltages VDSL and VSSL each having a 4.5 V level are supplied to the drain selection line DSL and the source selection line SSL to thereby respectively turn on the drain select transistor DST and the source select transistor SST.

The drain selection line voltage VDSL and the source selection line voltage VSSL each having a 4.5 V level are supplied to a selected memory block, and the drain selection line voltage VDSL and the source selection line voltage VSSL of 0 V are supplied to unselected memory blocks.

The selected word line voltage Vselwl is supplied to a selected word line. The selected word line voltage Vselwl has a read voltage which is determined according to a program state of a memory cell.

The unselected word line voltage Vunselwl is supplied to the remaining unselected word lines. The unselected word line voltage Vunselwl has a voltage level at which memory cells can be turned on irrespective of their program states.

If the threshold voltage of a selected memory cell is more than the selected word line voltage Vselwl, a corresponding bit line remains at a high level. If the threshold voltage of a selected memory cell is less than the selected word line voltage Vselwl, a corresponding bit line is discharged to 0 V.

Data read by sensing the voltage of the corresponding bit line are stored in the page buffer PB 128.

In the case in which the data read operation is performed as described above, it has to be performed on all of the pages of word lines in order to check a threshold voltage distribution of corresponding memory cells of a memory block, leading to an increased time. One or more pages can be logically included in each word line according to the number of bits which are stored in a memory cell.

In the control unit 160 of the nonvolatile memory device 100 according to this embodiment of the present invention, the memory 161 previously stores information about a threshold voltage distribution of normal reference cells.

Furthermore, whether an abnormal memory cell exists in a selected memory block can be determined by checking the threshold voltages of memory cells by reading some of the pages of the selected memory block and comparing the threshold voltage of each of the memory cells with the threshold voltage distribution of a reference cell.

To this end, the control unit 160 has to be able to newly recognize a test command for testing a threshold voltage distribution of memory cells. An address for a memory block and a page at which the test will be started and an address for a last memory block and a page at which the test will be terminated must be inputted along with the test command. Further, information with respect to a read voltage during data reading has to be inputted.

A method of analyzing a threshold voltage distribution of a memory cell according to an embodiment of the present invention is described below.

Figure 2:
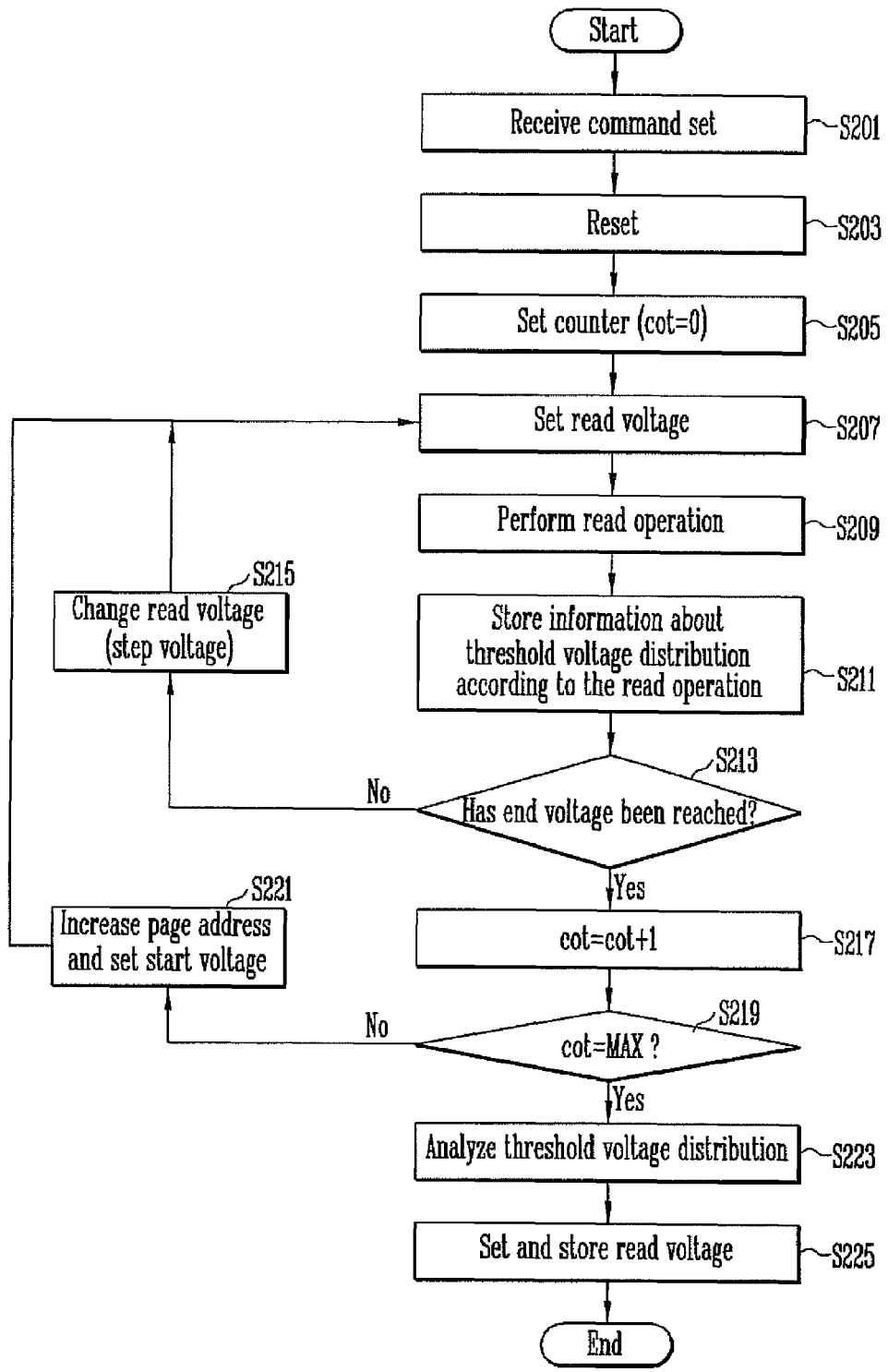
FIG. 2 is a flowchart illustrating an operation of analyzing a threshold voltage distribution of a memory cell in the nonvolatile memory device according to an embodiment of the present disclosure.

FIG. 2 is a flowchart illustrating an operation of analyzing a threshold voltage distribution of a memory cell in the nonvolatile memory device according to an embodiment of the present invention.

Referring to FIG. 2, as described above, to analyze a threshold voltage distribution of a memory cell, a command set is inputted at step S201. The command set can include a test command (Setup Command), first address information (Start page & block address) at which a test will be started, a first confirmation command (Confirm Command1), second address information (End page & block address) and second confirmation command (Confirm Command2) at which the test will be terminated, read voltage information (Voltage Parameter Value), and third confirmation command (Confirm Command3).

The first and second address information includes the page address of a memory block at which a test will be started and the page address of the memory block at which the test will be ended.

The read voltage information includes information about a read start voltage for a test, an end voltage, and a step voltage that raises the read voltage.

A word line on which the read operation will be performed is selected in response to the command set, and a latch of the page buffer 128 is reset at step S203. The counter 162 sets a count value 'cot' to 0 and, at the same time, sets a maximum value MAX of the operation loop based on the first and second address information at step S205.

Next, the read start voltage, included in the read voltage information, is set to the selected word line voltage Vselwl at step S207. The data read operation is then performed at step S209. The data read operation is the same as a known data read operation, and a description thereof has been omitted for the sake of brevity.

After data are read, a threshold voltage distribution of the memory cell according to the state of data of the page buffer PB 128 is checked, and information with respect to the threshold voltage distribution is stored in the memory 161 at step S211. A determination is then made as to whether the selected word line voltage Vselwl equals the end voltage included in the read voltage information at step S213.

If, as a result of the determination, the selected word line voltage Vselwl is determined not to equal the end voltage, the selected word line voltage Vselwl is raised by a step voltage included in the read voltage information at step S215, and the process returns to the step S207 in which a read voltage is set.

However, if, as a result of the determination, the selected word line voltage Vselwl is determined to equal the end voltage, the counter 162 increases the count value 'cot' by '1' at step S217 and then determines whether the increased count value 'cot' equals the maximum value MAX, set at the step S205, at step S219.

If, as a result of the determination at step S219, the count value 'cot' is determined to equal the maximum value MAX, the threshold voltage distribution of the memory cell is analyzed at step S223. The operation of analyzing the threshold voltage distribution of the memory cell is performed to determine whether there is an abnormal memory cell by comparing the threshold voltage distribution of a memory cell and the threshold voltage distribution of a reference memory cell, which are stored in the memory 161.

However, if, as a result of the determination at step S219, the count value 'cot' is determined not to equal the maximum value MAX, the page address is increased and the read voltage is set to the start voltage at step S221. Next, the process returns to step S207.

The read operation is performed on all read voltages, and threshold voltage distributions of memory cells coupled to selected word lines can be configured and analyzed. Next, an optimal voltage with consideration taken of a read margin is set based on the checked threshold voltage distributions and stored at step S225.

Option information, etc. are stored such that the read voltage set according to the operation of the flowchart of FIG. 2 can be used as a read voltage used while a subsequent nonvolatile memory device is operated.

According to the above operation, the control unit 160 can determine whether abnormal cells, such as slow cells, exist by comparing threshold voltage distributions measured for specific pages and a previously stored threshold voltage distribution of reference memory cells, determine the number of cells not belonging to a normal threshold voltage distribution, and send corresponding information externally. Accordingly, the characteristic of the memory cells can be analyzed, and memory cells that will have an internal fault can be determined. Furthermore, a read voltage having the least error can be set based on a threshold voltage distribution such that it can be used for a subsequent operation of a nonvolatile memory device.

As described above, according to the nonvolatile memory device and the method of operating the device in accordance with an embodiment of the present invention, the nonvolatile memory device includes an algorithm for calculating a threshold voltage distribution of a memory cell and stores information about a threshold voltage distribution of a standard memory cell. Accordingly, the time that it takes to analyze a threshold voltage distribution can be reduced, and information about an analyzed threshold voltage distribution can be provided for external use.

What is claimed is:

1. A nonvolatile memory device, comprising:
a control unit configured to:
calculate a threshold voltage distribution of each of selected pages, the threshold voltage distribution being calculated by repeatedly performing a read operation on each page from a start page to an end page while increasing a read voltage by a step voltage from a start read voltage to an end read voltage, in response to start page information and end page information of a command set for analyzing the threshold voltage distribution, the read operation being performed repeatedly until the read voltage reaches the end read voltage regardless of a compared result between the read voltage and threshold voltage of memory cells included in each of selected pages,
compare the calculated threshold voltage distribution with a predetermined reference threshold voltage distribution, wherein the reference threshold voltage distribution includes information as to a distribution of threshold voltages of reference memory cells, and
determine a read voltage having the least amount of errors for a subsequent read operation being performed according to the compared result.

2. The nonvolatile memory device of claim 1, wherein the command set comprises:
a command to initiate analysis of a threshold voltage;
a first address at which the analysis of the threshold voltage distribution is started, wherein the first address is an address of the start page;
a second address at which the analysis of the threshold voltage distribution is terminated, wherein the second address is an address of the end page, and
voltage information that includes the start voltage, the end voltage, and the step voltage.

3. The nonvolatile memory device of claim 2, further comprising a counter configured to set a loop frequency that the read operation according to the first and second addresses is repeated and to count a number of times that loops have been executed.

4. The nonvolatile memory device of claim 1, further comprising a memory configured to store the information of the reference threshold voltage distribution and the circulated threshold voltage distribution.

5. The nonvolatile memory device of claim 4, wherein the control unit is configured to determine the read voltage based on the information of the threshold voltage distribution, to store the determined read voltage in the memory, and to control the stored read voltage to facilitate using the stored read voltage upon the subsequent data read operation being performed.

* * * * *